United States Patent
Kums

(10) Patent No.: US 10,763,417 B2
(45) Date of Patent: Sep. 1, 2020

(54) THERMAL BLOCK ASSEMBLY, LED ARRANGEMENT WITH THE SAME, AND METHOD OF MANUFACTURING SAID THERMAL ASSEMBLY

(71) Applicant: Lumileds LLC, San Jose, CA (US)

(72) Inventor: Gerard Kums, Molenstede (BE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/098,832

(22) PCT Filed: Apr. 25, 2017

(86) PCT No.: PCT/EP2017/059709
§ 371 (c)(1),
(2) Date: Nov. 2, 2018

(87) PCT Pub. No.: WO2017/190974
PCT Pub. Date: Nov. 9, 2017

(65) Prior Publication Data
US 2019/0140155 A1    May 9, 2019

(30) Foreign Application Priority Data
May 2, 2016  (EP) ................................ 16167868

(51) Int. Cl.
*H01L 33/62*  (2010.01)
*H01L 33/64*  (2010.01)
(Continued)

(52) U.S. Cl.
CPC .......... *H01L 33/647* (2013.01); *F21V 29/713* (2015.01); *F21V 29/74* (2015.01);
(Continued)

(58) Field of Classification Search
CPC ....... H01L 33/62; H01L 33/64; H01L 33/642; H01L 33/647
(Continued)

(56) References Cited

U.S. PATENT DOCUMENTS

2004/0106234 A1    6/2004  Sorg et al.
2005/0263784 A1*  12/2005  Yaw ...................... H01L 33/54
                                                             257/98
(Continued)

FOREIGN PATENT DOCUMENTS

EP      1911389 A1   4/2008
EP      2816621 A1   12/2014
JP   2000150969 A    5/2000

*Primary Examiner* — Fazli Erdem
(74) *Attorney, Agent, or Firm* — Volpe and Koenig, P.C.

(57) ABSTRACT

The invention describes a thermal block assembly comprising a first thermally and electrically conductive block part realised for connection to an anode pad of a light-emitting diode (LED) and dimensioned to provide an essentially complete thermal path for heat originating at the anode pad; a second thermally and electrically conductive block part realised for connection to a cathode pad of the LED and dimensioned to provide an essentially complete thermal path for heat originating at the cathode pad; and a bonding layer applied to the block parts to fix the positions of the block parts on either side of a gap. The invention further describes an LED arrangement comprising said thermal block assembly and at least one LED mounted thereto, and a method of manufacturing said thermal block assembly.

14 Claims, 4 Drawing Sheets

(51) Int. Cl.
*F21V 29/71* (2015.01)
*F21V 29/74* (2015.01)
F21Y 115/10 (2016.01)
F21V 29/70 (2015.01)

(52) U.S. Cl.
CPC ............ H01L 33/62 (2013.01); H01L 33/642 (2013.01); *F21V 29/70* (2015.01); *F21Y 2115/10* (2016.08); *H01L 2933/0075* (2013.01)

(58) Field of Classification Search
USPC .......................................................... 257/99
See application file for complete search history.

(56) References Cited

U.S. PATENT DOCUMENTS

| | | | |
|---|---|---|---|
| 2009/0323346 A1 | 12/2009 | Chang | |
| 2010/0123164 A1* | 5/2010 | Suehiro | F21V 5/043 257/99 |
| 2011/0309404 A1 | 12/2011 | Lee | |
| 2013/0107525 A1* | 5/2013 | Woodgate | F21K 9/00 362/237 |
| 2015/0076549 A1 | 3/2015 | Gebuhr et al. | |
| 2015/0349231 A1 | 12/2015 | Hsieh et al. | |
| 2016/0131325 A1* | 5/2016 | Kratochvil | F21V 29/70 257/99 |
| 2016/0268238 A1* | 9/2016 | Reeves | H01L 33/486 |

\* cited by examiner

THERMAL BLOCK ASSEMBLY, LED ARRANGEMENT WITH THE SAME, AND METHOD OF MANUFACTURING SAID THERMAL ASSEMBLY

FIELD OF THE INVENTION

The invention describes a thermal block assembly, an LED arrangement, and a method of manufacturing a thermal block assembly.

BACKGROUND OF THE INVENTION

LEDs are becoming more widespread as light sources for general illumination purposes (e.g. as retro-fit light bulbs) but also for high-power applications such as automotive front lighting. A light-emitting diode (LED) comprises a semiconductor chip with an anode and a cathode. To include such an LED in an electronic circuit, it is generally provided in the form of a "package" ready for mounting, for example as a bottom-contacted chip with electrode pads—i.e. an anode pad and a cathode pad—arranged on the underside of the chip. These electrode pads can be bonded to appropriate conductors of a printed circuit board (PCB), previously etched from a conductive coating applied to a dielectric material layer.

An LED generates heat during operation, and the amount of heat is related to the power density of the LED. To avoid deterioration of the diode p-n junction owing to thermal damage, the heat must be drawn away from the LED. The trend is towards higher-power LEDs with smaller LED emission surface areas (smaller dies), and with correspondingly high power density ($W/mm^2$). High-power LEDs of the type used in lighting applications can become extremely hot. Therefore, to draw heat away from a bottom-contacted LED, a heatsink is generally mounted on the opposite side of the PCB. The primary heat sink is therefore accessed through the PCB, and a lead frame is used to channel the heat from the LED into the PCB material. Heat from the anode and cathode pads is taken up by the conductive tracks to which they are bonded, passes through the dielectric layer, and is taken up or dissipated by the heatsink. The dielectric layer or thermal-electrical interface is problematic since it has a detrimental affect on heat transfer from the LED. This is because the dielectric is primarily an electric isolator such as a polymer, meaning that it is generally a poor thermal conductor, with a thermal conductivity that is typically significantly lower than the thermal conductivity of most metals. The dielectric layer of a PCB therefore effectively presents a thermal barrier in the thermal path away from the LED.

Another problem with the prior art approaches is that the conductive tracks on a conventional printed circuit board are very thin, usually only a few tens of micrometres in thickness, and therefore have only a limited thermal capacity. In one approach to dealing with this problem, the conductive tracks are not etched from a thin layer of copper material, but are instead formed from a relatively thick layer of conductive material (a few hundreds of micrometres in thickness) using a suitable material removal technique such as micro-milling. However, even if the conductive tracks are made somewhat thicker to increase their thermal capacity, this has been observed to be insufficient for dealing with the quantities of heat generated by a high-power LED during operation.

Therefore, it is an object of the invention to provide an improved way of dissipating heat from an LED during operation that overcomes the problems mentioned above.

SUMMARY OF THE INVENTION

The object of the invention is achieved by the thermal block assembly of claim 1; by the LED arrangement of claim 9; and by the method of claim 11 of manufacturing a thermal block assembly.

According to the invention, the thermal block assembly is a self-contained unit comprising at least one first thermally and electrically conductive block part realised for connection to an anode pad of a light-emitting diode and providing an essentially complete thermal path for heat originating at the anode pad; and at least one second thermally and electrically conductive block part realised for connection to a cathode pad of the light-emitting diode and providing an essentially complete thermal path for heat originating at the cathode pad; and a bonding layer applied to the block parts to fix the positions of the block parts on either side of a gap.

A thermally and electrically conductive block part acts as a heat spreader or heatsink for dissipating the heat originating at an electrode pad. There are essentially three ways in which heat can leave a system, namely convection, conduction and radiation. Heat loss by convection is generally to the surrounding air; heat loss by conduction will be determined by the way the system or assembly is physically connected to other objects; and heat loss by radiation is usually only significant at higher temperatures. In the case of an LED heat sink, the primary modes of heat loss are convection and conduction. In the context of the invention, the expression "providing a complete thermal path for heat originating at an electrode pad" means that the relevant thermally and electrically conductive block part is essentially the sole conductor of heat away from the electrode pad to which it is connected via the three modes of heat loss outlined above, and may also be expressed as "providing complete thermal dissipation for heat originating at an electrode pad". With appropriate choice of material and form of the conductive block parts, these provide a complete thermal path in the sense that no other heat sink need be required to dissipate or sink the heat originating at that electrode pad. Therefore, the thermal block assembly is a self-contained unit in the sense that there is no need for any additional heatsink or heat spreader to cool the LED during operation. The dimensions (height, width, thickness etc.) of a thermally and electrically conductive block part can be chosen to ensure that the thermal capacity of that block part is sufficient to sink the heat from the LED electrode to which it will be connected.

In the context of the invention, a "light-emitting diode" may be understood to be an LED chip, for example as a chip-scale package (CSP) LED for placement in a lighting circuit. An advantage of the self-contained thermal block assembly according to the invention is that a block part ensures very efficient and effective heat transfer away from the hot electrode (anode or cathode) of the LED during operation, while at the same time acting as the direct electrical connector between a drive voltage terminal and that electrode. The term "self-contained" is used to indicate that the inventive thermal block assembly does not need to be mounted to contacts on a PCB for electrical connection to a driver; furthermore the inventive thermal block assembly does not have to be mounted to any further heat sink. Assembly of an LED arrangement can be simplified, since it is no longer necessary to prepare thermally dissipating conductive tracks on a PCB, neither is it necessary to solder the block parts of the thermal block assembly to a PCB. The thermal block assembly provides an uninterrupted and unrestricted heat flow path from one or more LEDs through the block parts and from thence to the surroundings, which can be mostly ambient air but which may also include a mechanical support upon which the thermal block assembly may be mounted. In the inventive thermal block assembly, dielectric material has been removed completely from the thermal path. In other words, there is no longer any thermal barrier between the source of heat (an electrode pad of an LED) and the main heat sink. The temperature of an LED chip can therefore be kept to a favourably low level by the efficient and effective heat transfer through the block parts. This can favourably extend the useful lifetime of any LED device or application incorporating the inventive self-contained thermal block assembly. Alternatively or in addition, the efficient heat transfer may allow the LED to be driven at a higher power (compared to a prior art thermal block assembly with an equivalent LED), so that the light output of the LED may be increased. This contrasts favourably with the prior art arrangements which are characterized by less efficient heat transfer away from the LED chip owing to the presence of a dielectric layer between conductive tracks and heatsink.

The first and second block parts are functionally and structurally separate elements, and face each other across the gap. To ensure structural stability of the assembly, the first and second block parts of the thermal block assembly are securely held in place by the bonding layer. In the context of the invention, a "bonding layer" is to be understood as a layer or sheet of a dielectric material, i.e. an electrically isolating material, that is stiff enough to provide a structural connection between two block parts. This can be achieved in any number of ways, depending on the shapes of the first and second block parts. For example, one or more bonding layers of a dielectric material may be used to bond the first and second block parts. In the inventive thermal block assembly, a bonding layer is arranged to lie essentially completely outside the thermal path. In one embodiment, a bonding layer is applied to lie over two co-planar outside surfaces of the first and second block parts, bridging the intervening gap but not extending into the gap. Alternatively, one or more bonding layers may be applied between two opposing surfaces of the first and second block parts in a plane orthogonal to the thermal path.

According to the invention, the LED arrangement comprises such a thermal block assembly and at least one light-emitting diode mounted to a thermal block by means of a first electrical connection between an anode pad of the light-emitting diode and a first block part and a second electrical connection between a cathode pad of the light-emitting diode and a second block part.

An advantage of the LED arrangement according to the invention is that the more efficient heat transfer can be achieved at favourably low cost. As will be explained below, the thermal block assembly can be manufactured or assembled using existing processes such as SMD reflow processes, so that the inventive LED arrangement can be realised without significant additional effort. The inventive LED arrangement with the LED mounted to the self-contained thermal block assembly may therefore be referred to as an "LED on a heatsink".

According to the invention, the method of manufacturing a thermal block assembly comprises the steps of providing first thermally and electrically conductive block part for connection to an anode pad of a light-emitting diode and dimensioned to provide an essentially complete thermal path for heat originating at the anode pad; providing a second thermally and electrically conductive block part realised for connection to a cathode pad of a light-emitting diode and dimensioned to provide an essentially complete thermal path for heat originating at the cathode pad; arranging the block parts on either side of a gap; and applying a bonding layer to the block parts to fix the positions of the block parts.

An advantage of the inventive method is that it allows a relatively economical manufacture of a thermal block assembly that is characterized by efficient heat transfer. Placement of the thermally and electrically conductive block parts to receive LED electrode pads provides a favourably unimpeded or unrestricted heat flow to effectively dissipate heat originating from the pads, and also ensures that the block parts can function as an electric connection to a driver. At the level of the upper surfaces of the block parts, the width of the gap preferably does not exceed the anode-cathode gap of the light-emitting diode chip which will be mounted to the thermal block assembly. The gap width can for example lie in the range of about 0.2 mm. The anode-cathode gap is to be understood in this context as the shortest distance between the anode and cathode electrodes of the LED chip, for example the shortest distance between the (usually rectangular) contacts on the bottom of a flip-chip LED. Here, the term "upper surface of the thermal block" is to be understood as the surface to which the LED is mounted, while the term "lower surface of the thermal block" is to be understood as the surface on the opposite side of the thermal block.

The dependent claims and the following description disclose particularly advantageous embodiments and features of the invention. Features of the embodiments may be combined as appropriate. Features described in the context of one claim category can apply equally to another claim category.

In the following, but without restricting the invention in any way, it may be assumed that the light-emitting diode is a bottom-contacted LED chip for which the anode and cathode pads are arranged underneath the LED chip. This type of LED chip is commonly referred to as a "flip chip". The terms "thermal block assembly" and "thermal block" are synonymous and may be used interchangeably in the following.

The advantageous thermal properties of the inventive thermal block assembly make it suitable for any application in which efficient heat transfer away from the LED is desirable and/or necessary. The thermal block assembly according to the invention is particularly suited for realisation in applications such as automotive front lighting arrangements, since the high light output required for a front beam is associated with high LED chip temperatures. The efficient heat transfer achieved by the thermally and electrically conductive block parts of the inventive thermal block assembly ensures a favourably long lifetime and a favourably high light output of an LED in an LED arrangement according to the invention. For example, in an automotive front lighting application, the inventive LED arrangement can incorporate a light-emitting diode with a power density of at least $1.0$ W/mm$^2$.

A thermally and electrically conductive block part can be made of any suitable material that is both a good thermal conductor and a good electrical conductor. Preferably, the block part is made of a metal such as copper. Preferably, a block part has a thickness of at least 1.0 mm, more preferably a thickness of at least 5.0 mm, most preferably a thickness of at least 20 mm. A block part can be made of a cast metal piece, and/or may be machined from a solid metal block using any suitable machining technique such as milling, turning, etc.

The anode connector and cathode connector of an LED chip package must be electrically isolated from each other. The gap between first and second thermally and electrically conductive block parts can be filled with a dielectric material. However, in a preferred embodiment of the invention, the gap is not filled with any dielectric material but is simply an air-gap. The advantage of an air-gap between the first and second thermally and electrically conductive block parts is that the LED is not subject to mechanical stress arising from uneven expansion of metal and dielectric materials.

The first and second block parts are functionally and structurally separate elements, and face each other across the gap. To ensure structural stability of the assembly, the first and second block parts of the thermal block assembly are preferably connected in some manner. This can be achieved in any number of ways, depending on the shapes of the first and second block parts. For example, one or more connecting or bonding layers may be used to connect or bond the first and second block parts. Such a bonding layer is preferably arranged to lie outside the thermal path. In one embodiment, a bonding layer is applied to lie over two co-planar outside surfaces of the first and second block parts, bridging the intervening gap but not extending into the gap.

Alternatively, one or more connecting or bonding layers may be applied between two opposing surfaces of the first and second block parts in a plane orthogonal to the thermal path. It is advantageous to electrically isolate the block parts from the surroundings. Such isolation can avoid a short-circuit across the electrodes of the LED, for example.

As described above, a connecting or bonding layer comprises a dielectric layer. Any suitable material can be used, for example a dielectric foil. For example, a dielectric bonding foil can be applied over adjacent or co-planar outer surfaces of the first and second block parts of a block-shaped assembly. One such foil can be applied over two opposite outer sides of the block-shaped assembly. This ensures that the entire assembly is structurally stable. Since the thermal block assembly is inherently thermally and electrically self-contained, and since the bonding layers ensure structural stability, the inventive thermal block assembly has the further advantage of not requiring any additional mechanical support.

A block part can essentially comprise a solid block of metal such as copper. Since the primary purpose of the block part is to effectively draw heat away from an electrode of the LED chip, it is advantageous to maximise the surface area of the block part. In a preferred embodiment of the invention, therefore, a block part comprises a number of cooling fins. These can be realised in a horizontal or vertical arrangement, for example, and are preferably directed to face into a cavity of the device that will contain the thermal block assembly in order to further enhance the heat dissipation of the block part. Such fins or laminar elements can significantly increase the heat transfer by convection to the ambient air.

The block parts can be constructed to have any suitable shape. For example, the first block part and the second block part comprise essentially identical structures, and may be geometric mirror-images of each other. The first block part and the second block part may be the same size, so that each block part has the same heat transfer capacity. For example, each thermal block part might be realised with an essentially rectangular shape, with a height in the region of 15.0-20 mm and a cross-sectional area in the region of 1.0 $cm^2$. Such a realisation may be suitable when sufficient space is available for the thermal block assembly. Heat will travel in all directions through the body of the block part, but since the height of the block part is greater than its width in this example, the main "thermal path" may be visualised to extend in a direction opposite to the light-emitting surface of the LED.

In a more compact application, the overall height available to the thermal block assembly may limited owing to design restrictions. In that case, the overall thermal block might be realised with an essentially rectangular or square shape, with a height in the region of 1.0-5.0 mm, and a width and/or depth in the region of 2.0 cm. In such an embodiment, the main "thermal path" may be visualised to extend radially outward from the LED. Preferably, the first block part is larger than the second block part. In a possible preferred embodiment, the first block part and the second block part comprise complementary structures. For example, part of the first block part can extend over the second block part. Such a realisation takes into account the fact that the anode of an LED can become significantly hotter than the cathode, and allows the thermal capacity of the first block part to be greater than that of the second block part.

The first and second block parts may be regarded collectively as a "primary heatsink". The heat transfer capability of the primary heatsink can be augmented by a secondary heatsink. For example, when a dielectric layer is applied over the adjacent outer surfaces of the first and second block parts, an outer structural support part may be applied over the dielectric layer. Such an outer support part may be used on two opposing sides of the thermal block assembly, for example.

The manufacture of the inventive thermal block assembly is favourably straightforward, requiring relatively few assembly steps as already indicated above. For example, when the thermal block assembly is constructed using two equally shaped thermally and electrically conductive block parts, these can be arranged to be physically separated by a gap. In this case, the method preferably also comprises a step of arranging a temporary spacer between the block parts. For example, a thin layer of plastic can be placed between opposing faces of the block parts. This spacer can later be removed.

In a further preferred embodiment of the invention, the method comprises a step of isolating the first block part from the second block part. This can be achieved for example by applying a dielectric layer over adjacent outer surfaces of the block parts. This can prevent an unintended electrical connection between the block parts connected to anode and cathode respectively. The dielectric layer can be applied using an adhesive, for example in a hot press process step. Since the block parts are preferably made of metal and may expand slightly due to the heat generated by the LED during operation, in such an embodiment the dielectric layer and the block part are preferably chosen to have essentially equal coefficients of thermal expansion. This can ensure that the dielectric layer does not detach from a block part. For example, the block parts may be made of copper, and the material for the dielectric layer may be chosen to have essentially the same coefficient of thermal expansion as copper in the plane of the dielectric layer. This plane may be regarded as the XY plane in Cartesian space. These essentially equal CTEs ensure that the anode-cathode gap remains stable (i.e. does not change significantly). This will be the case even if the Z-direction CTE of the dielectric material is higher than its XY-plane CTE and the CTE of the block parts, since the thermal block can easily be designed to allow for any thermal expansion of the dielectric material in the Z-direction.

The thermal block assembly according to the invention essentially comprises a number of physically distinct components united as a single unit. To ensure that the thermal block assembly is robust and stable, the components are preferably securely connected. In one preferred embodiment of the invention, two block parts are held in a specific configuration by dielectric layers secured by adhesive to the outer adjacent sides of the block parts. Additional stability can be achieved by attaching outer support part to the dielectric layers, for example an outer support part can be secured to a dielectric layer by adhesive.

The self-contained thermal block assembly according to the invention can accommodate multiple LED chips. For example, the first and second block parts can each comprise two physically separate elements with a gap in between. The gap between elements of a block part extends in a direction orthogonal to the air gap between first and second block parts. In one exemplary embodiment, two LED chips are to be arranged side by side. To this end, the first block part comprises two essentially identical first block part elements, and the second block part comprises two essentially identical second block part elements. Each of the two anode pads is bonded to a first block part element. Each of the two cathode pads is bonded to a second block part element. In another exemplary embodiment, three LED chips are to be arranged side by side. To this end, each block part comprises one larger element and one smaller element, and these are arranged offset to each other so that a first LED straddles the larger first block part element and the smaller second block part element; the second LED straddles the larger first block part element and the larger second block part element; and the third LED straddles the smaller first block part element and the larger second block part element.

Electrical circuits for mass-produced articles are generally manufactured using a high degree of automation. Each part must comply with strict design requirements to ensure error-free handling steps such as placement and soldering. The substrate to which an LED chip is mounted must be very precisely defined, since an even only slightly incorrect placement of the LED chip can be an unacceptable flaw. Therefore, in a further preferred embodiment of the inventive method, the components of the primary and/or secondary heatsink can be secured temporarily using suitable alignment means. For example, the first block part can be aligned relative to the second block part (across a temporary spacer) by means of a pin or bolt extending through holes in the block parts (and spacer). These can be removed later. In another preferred embodiment of the inventive method, an alignment means can be arranged on an outer face of a block part in order to define the position of a dielectric layer. In another preferred embodiment of the inventive method, a guide can be used to align a secondary heatsink relative to a block part. The guide can be screwed or bolted to the secondary heatsink to hold it in place during a curing step or hot press step, for example, and removed again once the thermal block is complete.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
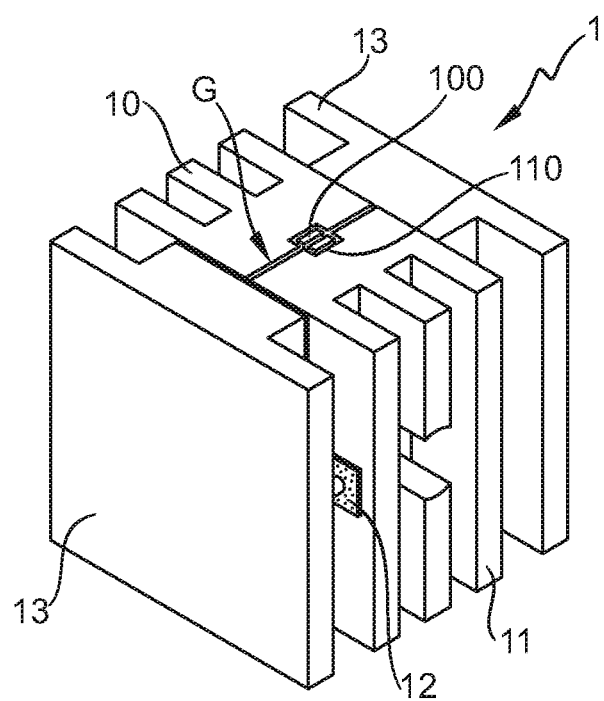
FIG. 1 shows a perspective view of a first embodiment of a thermal block assembly according to the invention.

FIG. 1 shows a perspective view of a first embodiment of a thermal block assembly 1 according to the invention. In this embodiment, the thermal block assembly 1 comprises two essentially identical block parts 10, 11 arranged to face each other across a gap G. These block parts 10, 11 each comprise a solid piece of metal such as copper and act collectively as a primary heat-sink. The height of each block part 10, 11 can be 10.0 mm or more, for example, and a horizontal cross-sectional area can be in the region of 1.0 cm$^2$. A "footprint" for an LED flip-chip has been formed, for example using a laser ablation process, to comprise separate placement areas 100, 110 on the upper surfaces of the block parts 10, 11. In a later manufacturing stage, the anode and cathode bottom contacts of a surface-mount LED device such as a CSP LED will be bonded to these placement areas 100, 110, for example using solder or an electrically conductive adhesive. In this exemplary embodiment, a dielectric layer 12 has been applied over the adjacent outer faces of the block parts 10, 11. Two outer supporting structures 13 have been arranged on either side of the primary heat-sink 10, 11. Together, these components 10, 11, 13 comprise the thermal block 1. Heat dissipation is ensured primarily by the direct or uninterrupted thermal path from a placement area 100, 110 through the material of the block part 10, 11. The two outer supporting structures 13 comprise a secondary heatsink that augments the thermal capacity of the primary heatsink.

Figure 2:
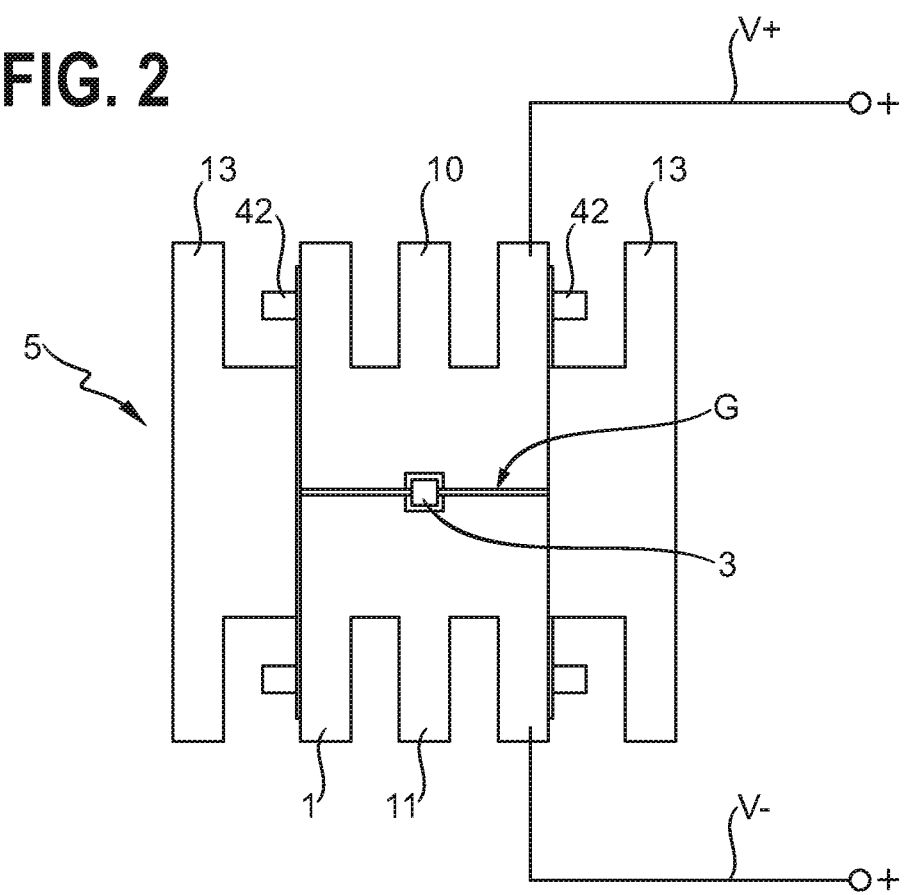
FIG. 2 shows a plan view of the thermal block assembly of FIG. 1 in an embodiment of the LED arrangement according to the invention.

FIG. 2 shows a plan view of an LED arrangement 2 comprising the thermal block assembly 1 of FIG. 1. This diagram shows a surface-mount LED chip in place on the upper surface of the thermal block assembly 1, straddling the block parts 10, 11 across the air gap G. FIGS. 1 and 2 also indicate alignment pins 42 used to align the dielectric layer 12 during assembly of the thermal block 1 as will be explained below.

Figure 3:
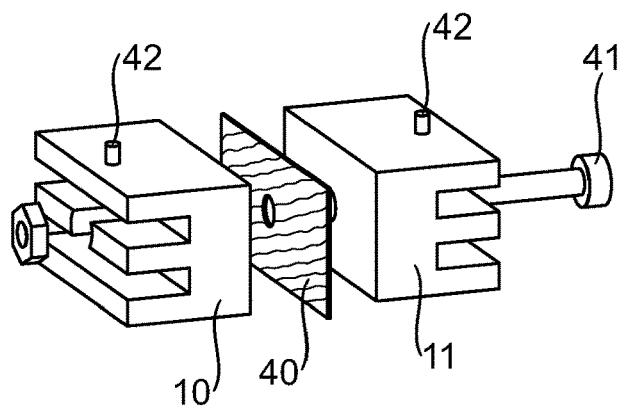
FIGS. 3-5 show assembly steps of an embodiment of the inventive method.
Figure 4:
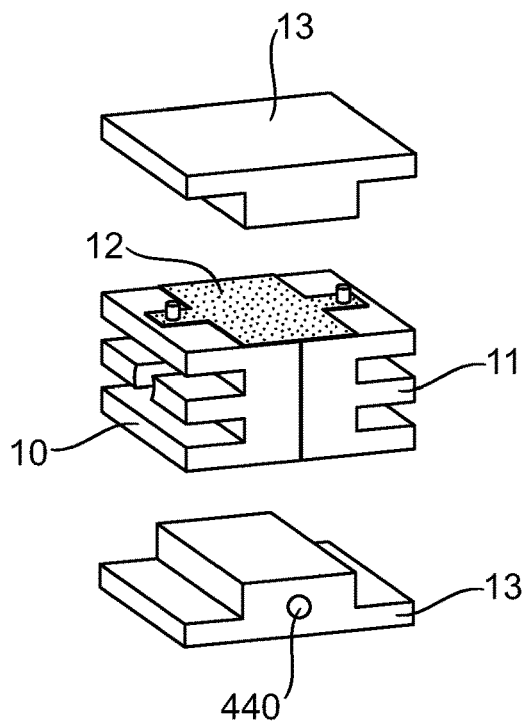
Figure 5:
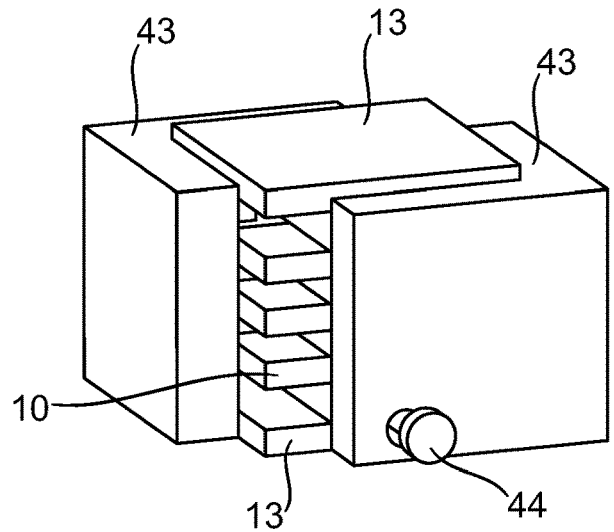

FIGS. 3-5 show assembly steps of an embodiment of the inventive method. In FIG. 3, two block parts 10, 11 have been prepared. A temporary spacer 40 is arranged between the block parts 10, 11. The diagram also shows a further temporary alignment bolt 41 which connects the two block parts 10, 11 and the spacer 40. FIG. 4 shows a subsequent step. Here, a dielectric layer 12 is applied on two opposing sides of the primary heatsink, extending over two adjacent side surfaces of the block parts 10, 11, and initially held in place by alignment pins 42. Two outer supporting structures 13 are shown ready for placement over corresponding dielectric layers 12. In this exemplary embodiment, a bushing 440, for example a threaded bushing, is provided in each metal block 13 (the diagram only shows one such bushing 440 facing out of the page). FIG. 5 shows a final assembly step. Here, two guides 43 are used to ensure exact alignment of the block parts 10, 11 and the outer supporting structures 13. The guides 43 are secured to the outer supporting structures 13 by bolts 44, each of two bolts 44 extending into a bushing 440 from one side of the assembly. The dielectric layers 12 can comprise adhesive material or may be coated with an adhesive. The alignment means 42, 43 ensure correct placement of the components 10, 11, 12, 13 before the adhesive acts to bond them. Once the adhesive has formed an effective bond, the temporary alignment means 40, 41, 43, 44 can be removed. An LED can then be mounted to the thermal block 1, for example by bonding its anode pad and cathode pad to appropriate regions on the first block part 10 and the second block part 11 respectively in an SMD reflow process stage.

Figure 6:
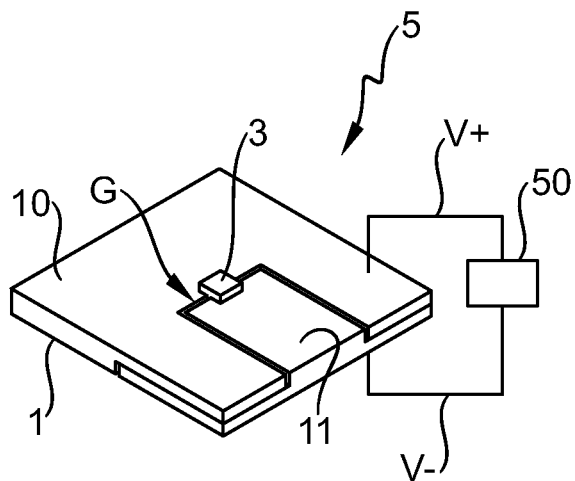
FIG. 6 shows a perspective view of a second embodiment of an LED arrangement according to the invention.
Figure 7:
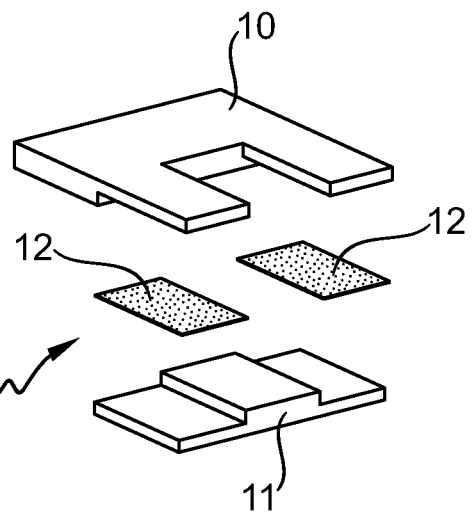
FIG. 7 shows an exploded view of the LED arrangement of FIG. 6.

FIG. 6 shows a perspective view of a second embodiment of a thermal block assembly 1 according to the invention, with an LED 3 in place. The diagram also indicates (very schematically) a driver 50 arranged to apply a positive drive voltage $V^+$ to the anode of the LED 3 via a first block part 10 of the thermal block assembly 1 and to apply a negative drive voltage $V^-$ to the cathode of the LED 3 via a second block part 11. In this exemplary embodiment, the LED arrangement 1 is realized in a compact manner. To this end, the thermal block 1 comprises two flat block parts 10, 11 with a large upper and lower surface area and a relatively small thickness, shown as an exploded view in FIG. 7. The height of the thermal block 10, 11 can be in the range of 1.0-5.0 mm. Since the anode of an LED can get hotter than the cathode during operation, the first block part 10 comprises a larger fraction of the thermal block assembly 1, and the second block part 11 comprises a smaller fraction of the thermal block assembly 1. Furthermore, the dimensions of each block part 10, 11 can be chosen to achieve a desired degree of mechanical stability. For one or both of these reasons, the volume (and mass) of the first block part 10 can be significantly greater than the volume (and mass) of the second block part 11. FIG. 7 also shows dielectric layers 12 in place, acting to electrically isolate the first block part 10 from the second block part 11 and also to permanently bond the block parts 10, 11.

Figure 8:
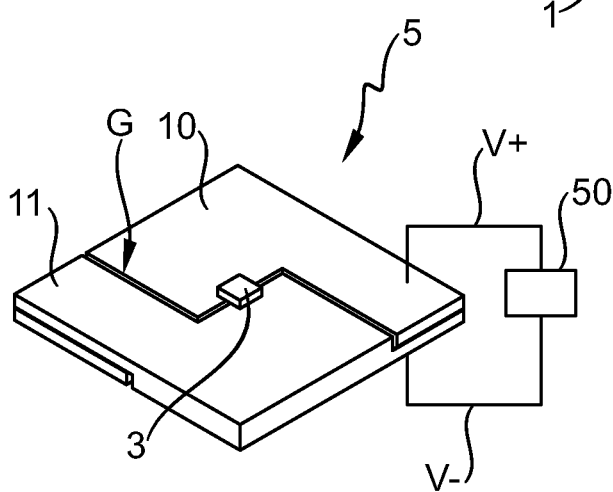
FIG. 8 shows a perspective view of a third embodiment of an LED arrangement according to the invention.
Figure 9:
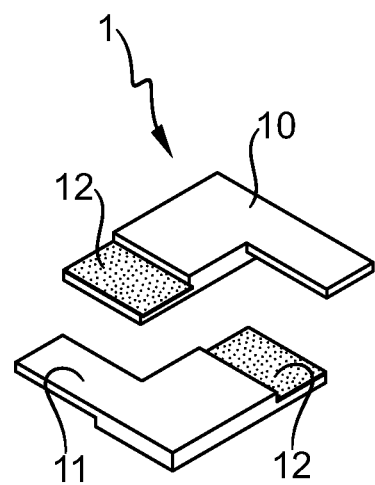
FIG. 9 shows an exploded view of the LED arrangement of FIG. 8.

FIG. 8 shows a perspective view of a third embodiment of a thermal block assembly 1 according to the invention. The diagram shows an alternative realisation of a compact LED arrangement 5. Here also, the thermal block 1 comprises two flat block parts 10, 11 with a large upper and lower surface area and a relatively small thickness, shown as an exploded view in FIG. 9. The diagram also indicates a driver 50 for applying a drive voltage to the anode and cathode through the block parts 10, 11 of the thermal block assembly 1.

Figure 10:
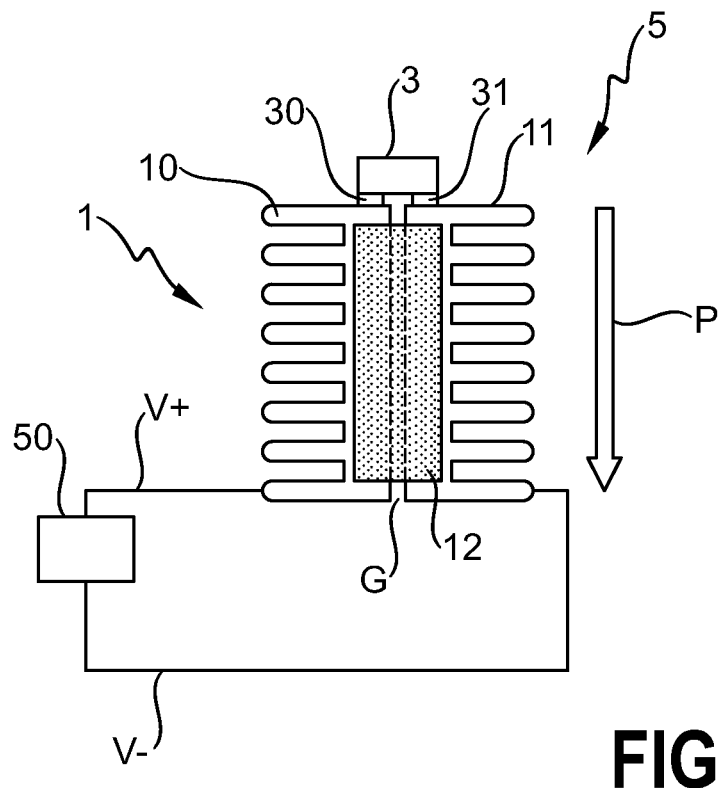
FIG. 10 shows a cross-section through an embodiment of an LED arrangement according to the invention.

FIG. 10 shows a schematic cross-section through an embodiment of the inventive LED arrangement 5. Block parts 10, 11 are held or bonded together by a dielectric layer 12 in a stable assembly 1 such that a gap G is formed between the block parts 10, 11. The LED chip 3 is shown in place, straddling the gap G between the block parts 10, 11. The bottom-contact anode 30 of the LED 3 is electrically connected to the first block part 10, and the bottom-contact cathode 31 of the LED 3 is electrically connected to the second block part 11. The diagram shows the uninterrupted thermal path P through each block part 10, 11. The diagram also indicates (very schematically) a driver 50 arranged to apply a positive drive voltage $V^+$ to the anode of the LED 3 via a first block part 10 of the thermal block 1 and to apply a negative drive voltage $V^-$ to the cathode of the LED 3 via a second block part 11.

Figure 11:
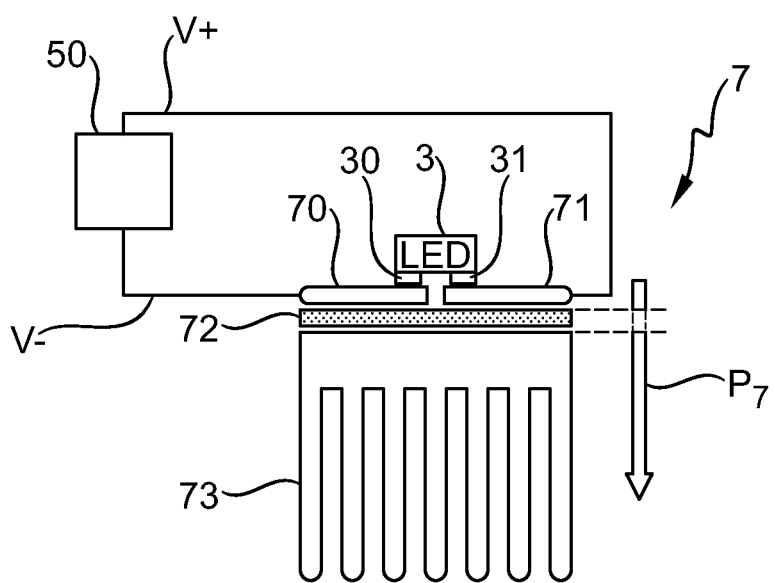
FIG. 11 shows a cross-section through a prior art LED arrangement.

FIG. 11 shows a cross-section through a prior art LED arrangement 7. Here, an LED 3 is mounted to conductive tracks 70, 71 that have been etched from a conductive layer applied to a dielectric 72 such as a polymer layer of a printed circuit board (PCB). The diagram also indicates (very schematically) a driver 50 arranged to apply a positive drive voltage $V^+$ to the anode of the LED 3 via a first conductive track 70 and to apply a negative drive voltage $V^-$ to the cathode of the LED 3 via a second conductive track 71. The dielectric 72 is mounted to a heatsink 73. Heat generated during operation of the LED 3 is transported away from the LED 3 first through the conductive tracks 70, 71, and must then pass through the dielectric layer 72 before reaching the heatsink 73. The conductive tracks 70, 71 can only dissipate a limited fraction of the heat, and the presence of the dielectric layer 72 detracts from the efficiency of the heatsink 73 since it presents a barrier in the thermal path $P_7$, indicated here by a split arrow.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A thermal block assembly comprising
   a first thermally and electrically conductive block part realised for connection to an anode pad of a light-emitting diode and dimensioned to provide an essentially complete thermal path for heat originating at the anode pad;
   a second thermally and electrically conductive block part realised for connection to a cathode pad of the light-emitting diode and dimensioned to provide an essentially complete thermal path for heat originating at the cathode pad;
   wherein both the first block part and second block part each comprises a number of cooling fins, and wherein the height of the block part is greater than the width of the block part; and
   a bonding layer comprising a dielectric layer arranged to adhere to at least one of the first block part or the second block part, the bonding layer applied to both the first block part and the second block part to fix the positions of each of the block parts on either side of an air-gap, which bonding layer is applied to lie over two co-planar outside surfaces of the first and second block parts, bridging the intervening air-gap but not extending into the air-gap and arranged to lie essentially completely outside the thermal path.

2. The thermal block assembly according to claim 1, wherein both the first block part and second block part each has a thickness of at least 1.0 mm, more preferably a thickness of at least 5.0 mm, most preferably a thickness of at least 20 mm.

3. The thermal block assembly according to claim 1, wherein both the first block part and second block part each comprises a solid block of metal, preferably copper.

4. The thermal block assembly according to claim 1, wherein the coefficient of thermal expansion of the bonding layer is essentially equal to the coefficient of thermal expansion of both the first block part and the second block part.

5. The thermal block assembly according to claim 1, wherein at least one of the first block part and the second block part is shaped to receive an electrode pad of a bottom-contacted light-emitting diode, preferably to receive an electrode pad of a chip-scale package bottom-contacted light-emitting diode.

6. The thermal block assembly according to claim 1, comprising two first block parts and two second block parts arranged for connection to two or more light-emitting diodes.

7. An LED arrangement comprising
a thermal block assembly according to claim 1; and
at least one light-emitting diode mounted to a thermal block by means of a first electrical connection between an anode pad of the light-emitting diode and a first block part and a second electrical connection between a cathode pad of the light-emitting diode and a second block part.

8. The LED arrangement according to claim 7, comprising a driver for applying a positive drive voltage to the first block part and a negative drive voltage to a second block part.

9. A method of manufacturing a thermal block assembly, which method comprises the steps of
providing first thermally and electrically conductive block part for connection to an anode pad of a light-emitting diode and dimensioned to provide an essentially complete thermal path for heat originating at the anode pad;
providing a second thermally and electrically conductive block part realised for connection to a cathode pad of a light-emitting diode and dimensioned to provide an essentially complete thermal path for heat originating at the cathode pad;
wherein at least one of the first block part and the second block part comprises a number of cooling fins, and wherein the height of at least one of the first block part and the second block part is greater than its width;
arranging at least one of the first block part and the second block part on either side of an air-gap; and
applying a bonding layer comprising a dielectric layer arranged to adhere to at least one of the first block part or the second block part, the bonding layer to at least one of the first block parts and the second block parts to fix the positions of at least one of the first block parts and the second block parts, which the bonding layer is applied to lie over two co-planar outside surfaces of the first and second block parts, bridging the intervening air-gap but not extending into the air-gap and arranged to lie essentially completely outside the thermal path.

10. The method according to claim 9, comprising the step of arranging a number of structural supporting parts against one or more outer surfaces of the first and second block parts.

11. The method according to claim 9, comprising the step of forming an adhesive bond between the bonding layer and at least one of the first block part and the second block part.

12. The method according to claim 9, comprising a step of arranging an alignment means on a part and/or through the part to align two or more parts of the thermal block assembly during a manufacturing stage.

13. The method according to claim 9, comprising a laser ablation step to form an anode placement area on a upper surface of a first block part and a cathode placement area on an upper surface of a second block part.

14. The assembly of claim 1, wherein the bonding layer includes a plurality of supporting structures associated with the dielectric layer.

* * * * *